United States Patent [19]
Glover et al.

[11] Patent Number: 6,104,611
[45] Date of Patent: *Aug. 15, 2000

[54] PACKAGING SYSTEM FOR THERMALLY CONTROLLING THE TEMPERATURE OF ELECTRONIC EQUIPMENT

[75] Inventors: Richard John Glover, Ottawa; Michael Reginald Bishop, Kingston; Michal Stefan Tencer, Nepean, all of Canada

[73] Assignee: Nortel Networks Corporation, Montreal, Canada

[ * ] Notice: This patent issued on a continued prosecution application filed under 37 CFR 1.53(d), and is subject to the twenty year patent term provisions of 35 U.S.C. 154(a)(2).

[21] Appl. No.: 08/725,778

[22] Filed: Oct. 4, 1996

Related U.S. Application Data

[60] Provisional application No. 60/004,812, Oct. 5, 1995.

[51] Int. Cl.$^7$ ...................................... H05K 7/20
[52] U.S. Cl. ...................... 361/700; 165/104.33; 361/719
[58] Field of Search ........................... 361/688, 698–700, 361/703, 704, 707, 708, 717–719; 174/15.2, 16.3, 252; 257/712–715; 165/104.21, 104.27, 104.33, 80.2, 80.3, 80.4, 80.5, 185, 10, 104.14

[56] References Cited

U.S. PATENT DOCUMENTS

| | | | |
|---|---|---|---|
| 3,851,221 | 11/1974 | Beaulieu | 317/100 |
| 4,306,613 | 12/1981 | Christopher | 165/32 |
| 5,076,351 | 12/1991 | Munekawa | 165/104.14 |
| 5,315,154 | 5/1994 | Elwell | 257/707 |
| 5,325,913 | 7/1994 | Altoz | 165/32 |
| 5,396,404 | 3/1995 | Murphy | 361/719 |
| 5,455,458 | 10/1995 | Quon | 257/714 |

OTHER PUBLICATIONS

Counter Flow Cooling, Chu, IBM Tech Discl Bull vol. 8 No. 11 Apr. 1966, pp. 1692.

*Primary Examiner*—Gerald Tolin
*Attorney, Agent, or Firm*—R. J. Austin; Victoria Donnelly

[57] ABSTRACT

A passive method and packaging system for thermally controlling the temperature of electronic equipment within a housing are disclosed. The packaging system provides for two cooling steps, each of which uses a different passive cooling technology. Cooling by changing the phase of Phase Change Material, assists in controlling internal ambient temperatures by limiting the effects of short term localized thermal phenomena which would otherwise further increase internal temperatures. Cooling is also provided for by switching on a second passive cooling means, preferably a heat pipe, as the internal temperature of the housing increases above a predetermined temperature and to switch it off as the internal temperature drops below the predetermined temperature. Turning the second passive cooling means on and off provides respectively, a low or high thermal resistance path between the interior and exterior of the housing. The second passive cooling means allows for cooling of the housing above the predetermined temperature as well as heating of the housing below the predetermined temperature by preserving heat generated by the equipment. The two cooling steps in combination, co-operate to limit both maximum and minimum temperatures within the housing and of components. The combination of cooling steps also allows control over the temperature delta between the maximum and minimum temperatures during internal temperature swings.

15 Claims, 4 Drawing Sheets

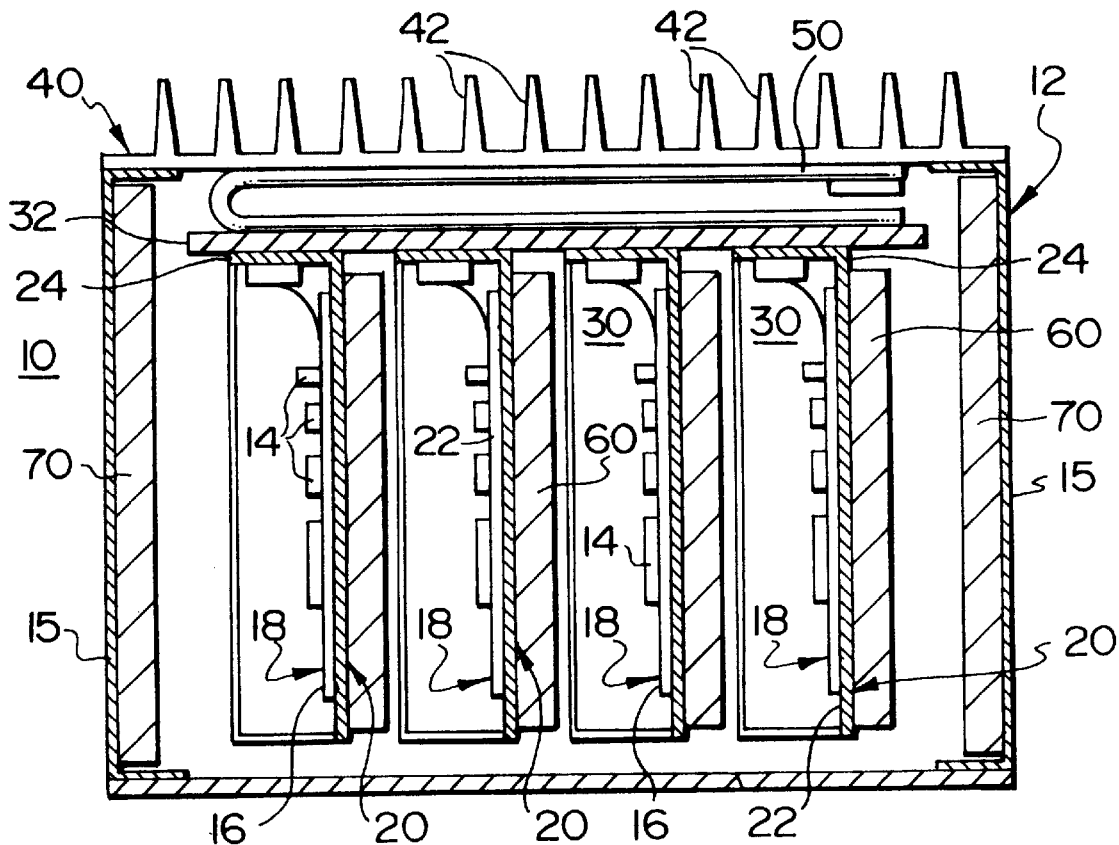
FIG. 1
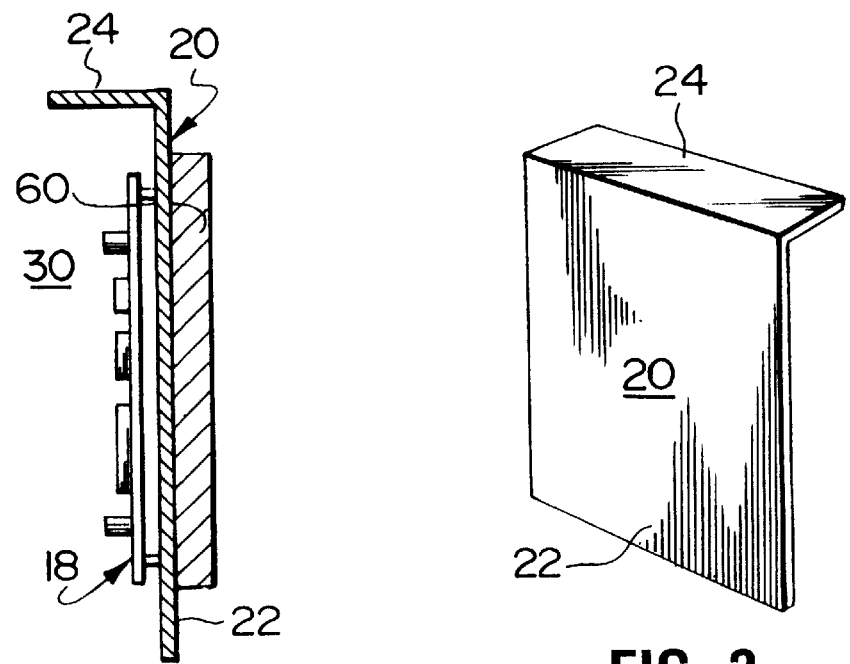
FIG. 2
FIG. 3

PACKAGING SYSTEM FOR THERMALLY CONTROLLING THE TEMPERATURE OF ELECTRONIC EQUIPMENT

This application claims benefit of Provisional Appl. No. 60/004,812 filed Oct. 5, 1995.

FIELD OF THE INVENTION

This invention relates to a passive method and packaging system for thermally controlling the temperature of electronic equipment.

BACKGROUND OF THE INVENTION

Electronic equipment which is to be located outdoors and placed within a housing structure to protect the equipment from mother nature, generally requires some method of regulating or controlling the internal temperature of the housing and the temperature of the electronic components. It is well known that the reliability of electronic components decreases significantly if they are subjected to high temperature extremes or to large temperature swings, especially if these swings or cycles are frequent. These temperature cycles can be due for example to electronic loading (e.g. peak telephone traffic times) or seasonal day-night temperature differences.

Conventional convection methods of temperature regulation within equipment housings have relied on maintaining internal ambient air temperatures within a predetermined range and to provide an airflow over the equipment to assist in the removal of component heat by an air medium. Component manufacturers have specific temperature ranges within which they guarantee their components will function reliably. A semi conductor component junction temperature range stated by a manufacturer will typically be in the range of −15° C. to +85° C. Generally speaking suppliers of electronic equipment will stipulate that their equipment (incorporating semi conductor components) if operated within a commercial operating zone (ambient temperature internal to a housing for example) of typically 0° C. to +50° C. will operate reliably. In other words operating their equipment in this commercial operating zone will ensure that component junction temperatures (−15° C. to +85° C.) set by component manufacturers will not be exceeded.

Service providers often provide air-conditioning units and or heating elements which are then thermostatically controlled. While this form of convection cooling (or heating) tends to be satisfactory for equipment housings which are either indoors or outdoors and in close proximity to electrical power, it is not an acceptable method for remote outdoor housing applications. Typical data communications cabling is not of sufficient size (gauge) to handle the power required by air-conditioning units or heating elements and hence at great expense, separate power cables must therefore be run out to the remote location. The ongoing year after year energy costs required to power such air-conditioning units and/or heating elements can also be significant. More importantly, it is generally accepted that if any degree of system reliability is to be realized, backup power systems (batteries/generators etc.) along with backup air-conditioning units and heating elements must be provided. These costs, all of which can be very significant, ultimately cut into profit margins of the equipment owners. In addition any breakdown in the heating and cooling equipment may result in disastrous and expensive breakdowns in the electronic equipment.

Many service providers in some developing countries when installing equipment even indoors do not wish to or can not afford to provide this costly form of temperature control system yet still require the highest degree of reliability possible from their equipment.

SUMMARY OF THE INVENTION

The invention seeks to provide a passive method and packaging system for thermally controlling the temperature of electronic equipment which minimizes the shortcomings above.

According to one aspect of the invention there is provided a method of cooling electronic equipment comprising the steps of providing a substantially sealed and insulated housing enclosing the electronic equipment; cooling the equipment using first passive cooling means comprised of phase change material disposed within the housing, by changing the phase of the phase change material as temperature within the housing increases above a first predetermined temperature thereby limiting further increases in temperature internal of the housing; cooling the equipment by switching on a second passive cooling means as temperature within the housing increases above a second predetermined temperature to provide a low thermal resistance path between the interior of the housing and the exterior of the housing; and switching off the second passive cooling means as temperature within the housing decreases below the second predetermined temperature so as to provide a high thermal resistance path between the interior of the housing and the exterior of the housing thereby preserving heat generated by the equipment.

Providing two cooling steps, each using a different passive cooling technology enables passive cooling of remote electronic equipment housings. Cooling by changing the phase of Phase Change Material, assists in controlling internal ambient temperatures by effectively limiting or regulating the effects of short term localized thermal phenomena which would otherwise further increase internal temperatures. Cooling by switching on and off a second passive cooling means above and below a predetermined temperature to provide respectively a low or high thermal resistance path between the interior and exterior of the housing. Switching on and off the second passive cooling means as described enables cooling of the housing above the predetermined temperature as well as heating of the housing below the predetermined temperature by preserving heat generated by the equipment when the second passive cooling means is in an off state. The two cooling steps in combination, co-operate to limit both maximum and minimum temperatures within the housing. Maximum and minimum temperatures within the housing and of components can thus be kept to within accepted manufacturer's specifications but as well the delta between the maximum and minimum temperatures during temperature swings can be controlled or reduced to further increase reliability.

Advantageously, in many climates the changing the phase of the phase change material occurs at a first predetermined temperature which is higher than the second predetermined temperature of the second passive cooling means.

Advantageously, changing the phase of the phase change material occurs in the range of between 30–80° C. and wherein switching on and off of the second passive cooling means occurs at the second predetermined temperature of about 0° C.

Preferably, changing the phase of the phase change material occurs in the range of between 35–60° C.

According to another aspect of the invention there is provided an outdoor packaging system for housing electronic equipment comprising a substantially sealed and insulated housing for housing the equipment; first passive cooling means comprising phase change material disposed internal of the housing for absorbing heat above a first predetermined temperature thereby limiting further increases in temperature internal of the housing due the effects of short lived thermal phenomena; and second passive cooling means comprising; heat sink means disposed externally of the housing; passive switch means for switching on the second passive cooling means above a second predetermined temperature to provide a low thermal resistance path between the interior of the housing and the heat sink to effect cooling of the equipment and for switching off the second passive cooling means below the second predetermined temperature to provide a high thermal resistance between the interior of the housing and the heat sink to thereby preserve heat generated by the equipment and effect heating of the housing.

The combination of technologies provides passive control over cooling required as a result of localized short term thermal spikes as well as continuous equipment power dissipation and external solar heating. This arrangement also benefits from having the ability to effectively turn off further cooling during periods of cold weather, thus preserving internally generated heat.

Advantageously, the passive switch means includes a heat pipe to efficiently conduct heat almost isothermally from inside of the housing to the heat sink means.

Preferably the passive switch means includes a Variable Conductance Heat Pipe, which is best suited to transferring heat at near constant temperature even where variable thermal loads and environments are encountered.

Conveniently a heat distributing structure is disposed throughout the PCM to more evenly subject the whole of the PCM to local ambient temperatures and preferably the heat distributing structure comprises a metal honey comb structure or a metal filamentery material randomly disposed through out the PCM.

Advantageously, the electronic equipment comprises electrical components thermally and electrically conductively attached to a substrate, the substrate being thermally conductively attached to a highly thermally conductive member to form a module, the module being removably thermally conductively attached to the second passive cooling means.

Preferably the packaging system further comprises a highly thermally conductive heat spreading means, thermally conductively attached to the second passive cooling means and wherein each module is removably thermally conductively attached to the heat spreading means whereby individual module heat is combined and efficiently conducted to the second passive cooling means.

BRIEF DESCRIPTION OF THE DRAWINGS

Embodiments of the invention will now be described, by way of example, with reference to the accompanying drawings in which:

FIG. 1 is a cross sectional view in side elevation of a packaging system for cooling electronic equipment according to a first embodiment;

FIG. 2 illustrates an electronic module in side elevation of the packaging system of FIG. 1;

FIG. 3 is a perspective view of a support member used in the electronic module of FIG. 2;

DETAILED DESCRIPTION

Electronic equipment which incorporate semi conductor components must provide ways of controlling the temperature the components in order to maintain component junction temperatures within the manufacturers specified range of typically −15° C. to +85° C. Another reliability requirement is to keep the components as well as substrate surfaces at a minimum of 7–10° C. above the external ambient temperature thereby minimizing humidity related problems from occuring. For example condensation causes moisture buildup on surfaces which for electronic equipment may cause electrolytic/galvanic corrosion. As well, ion ladened moisture on and between signal tracks may also reduce reliability by causing leakage from one track to the other.

Figure 6:
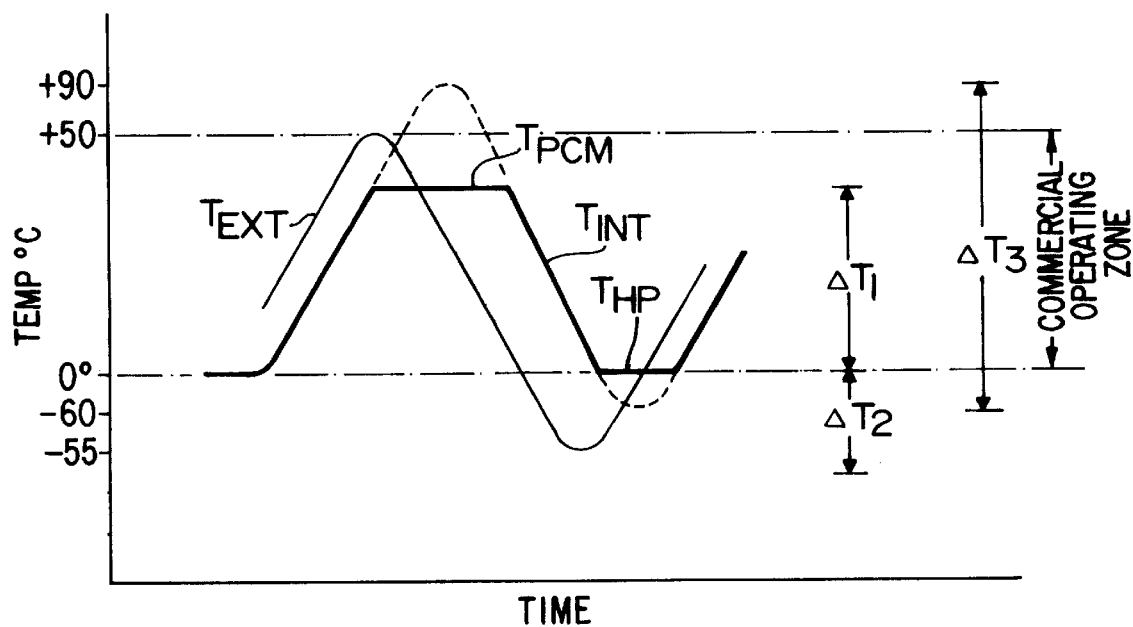
FIG. 6 is a graphical representation of example temperature cycles both external and internal to the packaging system of FIG. 1.

Daily temperature swings will vary from one geographical location to another and for illustrative purposes only, one example of a worst case positive and worst case negative outdoor ambient temperature extreme ($T_{EXT}$) is shown in FIG. 6. An insulated outdoor equipment housing as is known in the art when subjected to the worst case positive or negative temperature extreme will undergo a delayed internal temperature swing ($T_{INT}$) and will generally peak at a temperature which is higher than the external ambient maximum as well as reach a minimum temperature which will be above the external ambient minimum. Differences between respective maximums and respective minimums is due largely to the heat produced by the actual equipment which is internal to the housing. As can be seen from FIG. 6, anytime an outdoor housing without some form of cooling, is subjected to an external ambient ($T_{EXT}$) temperature peak (e.g. +50° C.) the temperature internal ($T_{INT}$) to the housing can very often reach a peak of around +90° C. (shown in chain dot) which is well above the desired maximum internal ambient temperature of +50° C. Similarly, anytime an outdoor housing is subjected to an external ambient ($T_{EXT}$) temperature minimum of −55° C., the temperature internal to the housing can very often reach a minimum of around −30° C. (also shown in chain dot) which is lower than the desired minimum internal ambient temperature of −10° C. As was stated earlier, operating electronic equipment at these extremes will shorten component life span and generally the reliability of the equipment. It is also known that cycling operating temperatures even if the minimums and maximums are within the rated range, reduces the life span and reliability of equipment. The greater and more frequent the temperature swing the less reliable the equipment may be. In many applications such as communications for example this is not satisfactory. Ideally, to increase reliability it is desirable that the equipment in its ambient surroundings, be only subjected to temperatures within the commercial operating zone and in particular, the delta between maximum and minimum temperatures ($\Delta T_3$) during any temperature cycle.

Equipment enclosure 10 of the embodiment of FIG. 1 comprises a substantially sealed and insulated housing 12 which utilizes a combination of PCM and heat pipe technologies to provide efficient passive conductive cooling of electronic equipment. The housing 12 of the embodiment of FIG. 1 includes a diffusion passage for water vapor and a conventional access door (both of which are not shown). The diffusion passage ensures that the absolute humidity levels inside and outside of the housing are the same which helps to reduce condensation related problems. Components 14 are thermally and electrically conductively attached using known techniques to a substrate 16 (printed circuit board) to form a circuit pack 18. The substrate 16 of each circuit pack 18 is in turn thermally conductively attached to a facing surface of a major planar arm 22 of an 'L' shaped support member 20 having high thermal conductive characteristics such as aluminum for example. The 'L' shaped support member 20 can be better visualized with reference to FIG. 3 in which it is shown in perspective view. The major planar arm 22 of each 'L' shaped support member 20 is of comparable surface area to the substrate 16 of a respective circuit pack 18. A circuit pack 18, connected to a respective support member 20, form an electronic module 30. Electronic modules 30 in turn are thermally conductively attached in the following manner, to a highly thermally conductive heat spreading plate 32 which is disposed directly above the electronic modules 30. One surface of the small planar arm 24 of each 'L' shaped support member 20 is thermally conductively attached using known techniques (thermal epoxies etc.) directly to a facing planar surface of the large rectangular heat spreading plate 32. A convection heat sink 40 forms at least a portion of the housing's 12 exterior wall directly above and spaced apart from the heat spreading plate 32. Fins 42 of the heat sink 40 are open to the ambient environment external to the housing 12. Thermal transistors in the form of a heat pipes 50 (only one being visible in FIG. 1) are disposed in the region between the heat sink 40 and the heat spreading plate 32 and are thermally conductively attached to an exteriorly facing surface of the heat spreading plate 32 and to the inwardly facing surface of the heat sink 40. Phase change material is encased within a highly thermally conductive framework to form circuit pack PCM modules 60. Each module 60 is sealed to the extent that it is able to contain the PCM during all stable phase states and transitions. PCM modules 60 are thermally conductively attached to the rear surface of the major planar arm 22, directly opposite respective circuit packs 18. Wall PCM modules 70 having different dimensions to the circuit pack PCM modules 60, are thermally conductively attached to an interior surface of each of the side walls 15 of the housing 12.

In operation, two cooling technologies are used in combination to provide efficient passive cooling of the components 14 within enclosure 10. FIG. 6 illustrates graphically an example temperature swing $\Delta T_3$ internal ($T_{INT}$) of the housing resulting from a temperature swing external ($T_{EXT}$) of the housing. Shown in chain dot are the maximum and minimum peak ambient internal temperatures that the housing would be subjected to without any form of cooling in place. A housing in accordance with the invention can clip or limit the maximum peak internal temperature at the PCM threshold temperature ($T_{PCM}$) and as well limit the minimum peak internal temperature at the Heat Pipe threshold temperature ($T_{HP}$). Raising the Heat Pipe threshold temperature ($T_{HP}$) to a temperature above the −10° C. lower limit set by the commercial operating zone further reduces $\Delta T_3$ therefore further increasing reliability. Heat pipe technology is used to efficiently conduct heat almost isothermally from inside of the housing 12 to a convection heat sink 40, external of the housing whenever the ambient internal temperature is above a predetermined first threshold temperature ($T_{HP}$) of for example 0° C. Phase Change Materials in the form of circuit pack PCM modules 60, 70, 80 further assist in controlling internal ambient temperature by effectively limiting or regulating the effects of short term localized thermal phenomena which might further increase internal temperatures above a second predetermined PCM threshold temperature ($T_{PCM}$). For reasons of minimizing costs and enclosure size, heat pipes are designed, generally for average daily thermal conditions and not short term peak thermal phenomena. Short lived localized thermal loads or peaks (e.g. adjacent circuit packs) due to for example to increased equipment loads can be effectively absorbed by the PCM modules 60 through the latent heat of fusion, above a second predetermined temperature ($T_{PCM}$) for example in the range from 30–60° C. to thus limit or prevent any further increase in internal temperature. Wall PCM modules 70 similarly may prevent any further increase in internal temperature as a result of external solar temperature peaks. During periods of colder weather the internal minimum ambient temperature is regulated by effectively turning off the heat pipe 50 to thus provide a high thermal resistance between the interior of the housing 12 and the heat sink 40 to thereby preserve heat generated by the components 14 and effect heating of the housing 12.

In more detail, power in the form of heat dissipation from components 14, is thermally absorbed by the major arm 22 of respective 'L' shaped support members 20 and through conduction is carried via each major arm 22 to the heat spreading plate 32. Each 'L' shaped support member 20 operates in this manner to absorb and conduct heat away from respective circuit packs 18 and thermally carry it through conduction to the heat spreading plate 32. When the heat spreading plate 32 reaches a predetermined temperature ($T_{HP}$, signifying the need for cooling), the thermal transistor or in the embodiment the heat pipe 50 effectively turns on and conducts the heat energy from the heat spreading plate 32 out of the housing to heat sink 40 where fins 42 then vent this excess heat to the external ambient air. Utilizing a thermal transistor enables the housing 12 to contain or preserve internally generated heat from the components 14 for example during extreme cold periods such as in the winter or during a cold night portion of a daily temperature cycle. Preserving internally generated heat by turning off the conduction of heat to the heat sink 40 below a predetermined temperature provides two advantages. Firstly, it effectively limits any further downward trend of the internal temperature below a predetermined engineered value (e.g. 10° C.). Benefits gained by doing this result from increasing the temperature differential ($\Delta T_2$ FIG. 6) between ambient temperatures inside and outside the housing (humidity/condensation concerns) and of further reducing the temperature delta $\Delta T_1$ between internal cycle minimums and maximums. As was mentioned earlier, cycling operating temperatures even if the minimums and maximums are within the rated range, reduces the life span and reliability of equipment. As well, providing a means to effectively remove or switch off the low thermal resistance path provided by the heat pipe when it is essentially on, may under certain atmospheric conditions prevent moisture within the air surrounding the circuit packs 18 from condensing onto component 14 and circuit pack substrate 16 surfaces. For example under certain conditions a night sky can represent a radiant temperature in the range of −50° C. even though the ambient temperature external to the housing may only be in the range of −10° C. In a housing for example having a heat sink facing the night sky and which is directly thermally coupled to the electronic equipment (i.e. no thermal transistor or switch in series with the heat sink), there will be a substantially small but constant thermal resistance between the night sky and the equipment of typically around 10° C. Under these conditions, the air around the electronic equipment may reach temperatures as low as −40° C. which is significantly lower than the external ambient temperature (of −10° C.) and hence moisture from the air surrounding the equipment will inevitably condense onto component and substrate surfaces (reducing the reliability of the equipment). However, in a housing according to the invention the thermal transistor (the heat pipe 50 in the embodiment) turns off under the same conditions and effectively then provides a very high thermal resistance in series with the heat sink or between the night sky and the equipment, thus reducing condensation concerns by preventing the interior ambient temperature from dropping below the exterior ambient temperature.

It should be apparent from FIG. 6 that there is a predictable maximum duration of time (for a given geographical area) where the temperature internal to the housing may exceed the rated maximum or minimum temperatures of the equipment due to external temperature fluctuations in ambient surroundings. These short time duration's are usually only a few hours for many applications. Short lived internal thermal increases may also for example be due to increased equipment electrical loads. In the telecommunications industry for example there are predictable periods within each day of the year where telephone equipment usage increases dramatically (e.g. over the lunch hour, Christmas Day, etc.) which increases the load on respective equipment and hence power dissipation of the equipment. These short lived thermal increases can raise the internal ambient and component temperatures above the rated values.

Phase change materials (PCM) exhibit characteristics which when used internally to an equipment housing will help to effectively cool the equipment by limiting and regulating the temperature within the housing to a predetermined value. It is known that Phase Change Materials through the latent heat of fusion are able to absorb significantly more heat during the change of state phase than in their stable states, i.e. either before or after the change of state phase. During the change of phase state, PCM absorbs heat energy with little or no increase in the temperature of the material itself. PCM can therefore be used to passively cool and regulate the temperature within a housing. The degree of cooling achievable is dependent upon the amount of PCM used, the type used and the placement of the PCM within the housing. As well, different types of PCM's change phase at different predetermined threshold temperatures and hence the point at which cooling takes place can be engineered by choosing the appropriate material; for example, Paraffin Waxes change phase in the range of 43–56° C., Disodium Phosphate Dodecahydrate changes phase around 36° C., and Neopentyl Glycol changes phase around 43° C. In this specification phase change materials (PCM) include not only those materials which go from a liquid phase to a solid phase a back to a liquid phase such as Paraffin Waxes do, but also includes those materials such as Neopentyl Glycol which go from a first solid phase to a second solid phase; with the difference between first and second solid phases being that each solid phase exhibits a different crystalline structure. By definition these materials are phase change materials which change from one solid phase having one crystalline structure to a second solid phase having a different crystalline structure.

For a predictable short term thermal spike such as high noon sun loading or peak equipment load times, the amount of PCM disposed within the housing can be engineered to effectively limit and regulate internal temperatures over the complete duration of the thermal spike. Where larger amounts of PCM are to be used for peak thermal spikes lasting a few hours or more it has been found that as the PCM (e.g. paraffin wax) changes phase it often does not do so uniformly and hence the desired temperature regulating characteristics during the phase change may not be realized. As well some of the available thermal absorption capacity of the PCM will not be realized if all of the material is not permitted to undergo the phase change (i.e. some of it does not melt).

Figure 7:
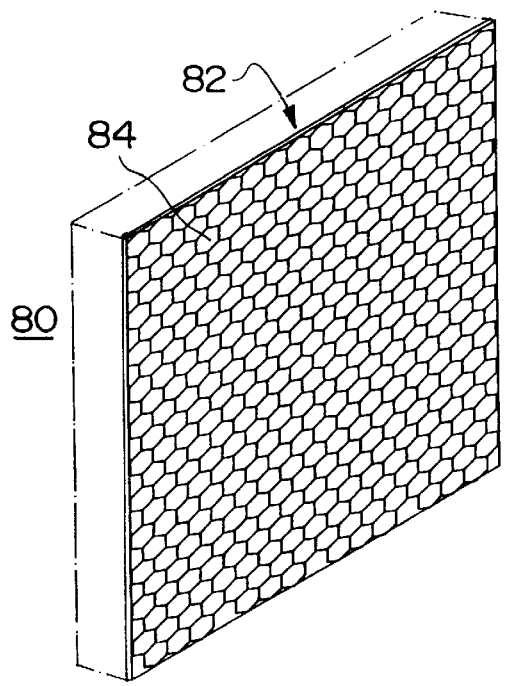
FIG. 7 is an alternate embodiment of a Phase Change Module shown in perspective view, for use in the packaging system of FIG. 1 and is shown containing a honey comb heat distributing structure.
Figure 8:
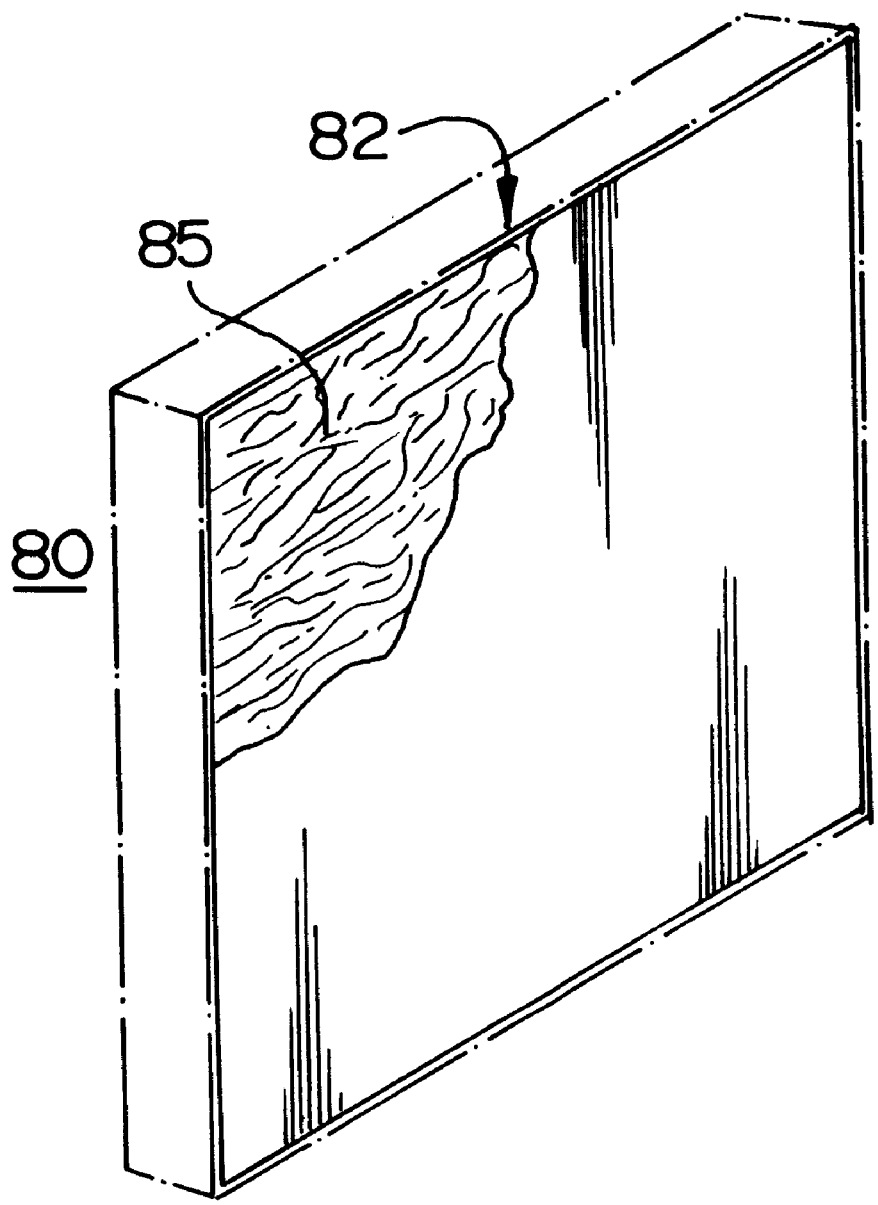
FIG. 8 is a perspective view of the module of FIG. 7 and is shown containing a filamentary heat distributing structure.

Research done by the applicant suggests that as larger amounts or masses of PCM change state, interface regions may be created between that portion of the material which is still in the solid state and that portion which is in the liquid state. It is believed that the outer melted layers form and effective insulation region between the still solid layers and the heat source; or stated in other words, the thermal resistance of the melted layer increases in effect and as a result causes the PCM to not change state uniformly. This non-uniform change of state may result in a slower and uneven rate at which the PCM can absorb heat energy and hence a loss in heat regulation may be realized. Preferably the PCM may be placed within a heat distributing structure constructed of any material having good thermal conducting properties. An example of such a structure is illustrated in FIG. 7. The honey-comb structure 84, fabricated from aluminum is encased within a framework 82 to contain the PCM and form a PCM module 80. The honey-comb heat distributing structure 84 more evenly subjects the whole of the contained PCM to local ambient temperatures which allows the PCM to change state at an even rate. Filamentary structures 85 as shown in FIG. 8, resembling coarse steel wool but made of aluminum, have also provided very good results with regard to distributing heat evenly throughout the PCM.

Figure 5:
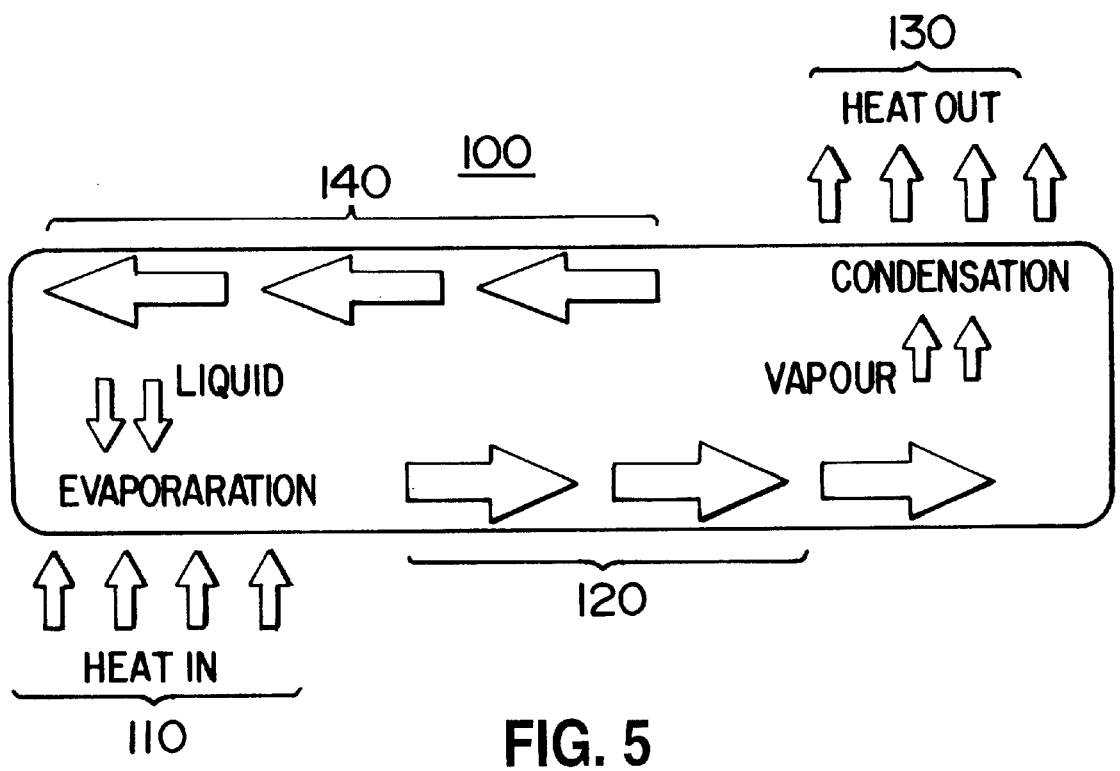
FIG. 5 is illustrative of a basic Heat Pipe.

Heat pipe technology in combination with Phase Change Materials can control temperature levels more efficiently within an equipment enclosure. Heat Pipes require no external power, have no moving parts, are sealed units, can be designed to operate over a very wide temperature range, and can be constructed to take on virtually any desired shape (tubes, flat plates etc.). Heat Pipes can transfer high heat loads while incurring only very small temperature drops (typically 1–2° C.) across the heat pipe. In their most basic form (FIG. 5) a heat pipe 100 comprises an evaporator 110, a vapor transport medium 120, a condenser 130, and a liquid return medium 140. In operation the evaporator 110 portion of the Heat Pipe 100 is subjected to an undesired heat load where at a predetermined temperature, the liquid internal to the evaporator 110 vaporizes. The hot vapor is then allowed to flow along the vapor transport medium 120 towards the condenser 130 where it then condenses. While condensing, heat contained within the vapor is rejected and the liquid is returned back to the evaporator 110 by capillary forces within the liquid return medium 140 so that the process may be repeated. Some form of heat sink is disposed in thermal contact with the condenser 130 portion of the heat pipe 100 so as to conduct the undesired heat out of the housing to the external ambient air. Heat pipes can be designed to effectively turn off at a predetermined temperature by choosing a liquid which will essentially freeze at that temperature. Once the liquid freezes the evaporate/condense cycle ceases and the heat pipe effectively presents a very high thermal resistance between the heat sink and the inside of the housing.

The Heat Pipe configuration just described generally is referred to as an Isothermalizer and can have multiple evaporators and condensers and may use either gravity or a wick as the liquid return medium. A preferred heat pipe 50 shown in FIG. 1 and more clearly in FIG. 4, referred to as a Variable Conductance Heat Pipe (VCHP) includes a reservoir 135 of non-condensable gas where the gas expands or contracts depending on temperature and hence pressure of the vapor from the Evaporator. Generally in a VCHP, vapor temperature in the Evaporator increases as a result of an increased thermal load which in turn causes the vapor pressure within the Evaporator to increase. As a result of this increase in pressure the non-condensable gas in the reservoir compresses, thus exposing more active condenser surface to the hot vapor. A Variable Conductance Heat Pipe is best suited to transferring heat at near constant temperature in applications where variable thermal loads and environments are encountered.

Figure 4:
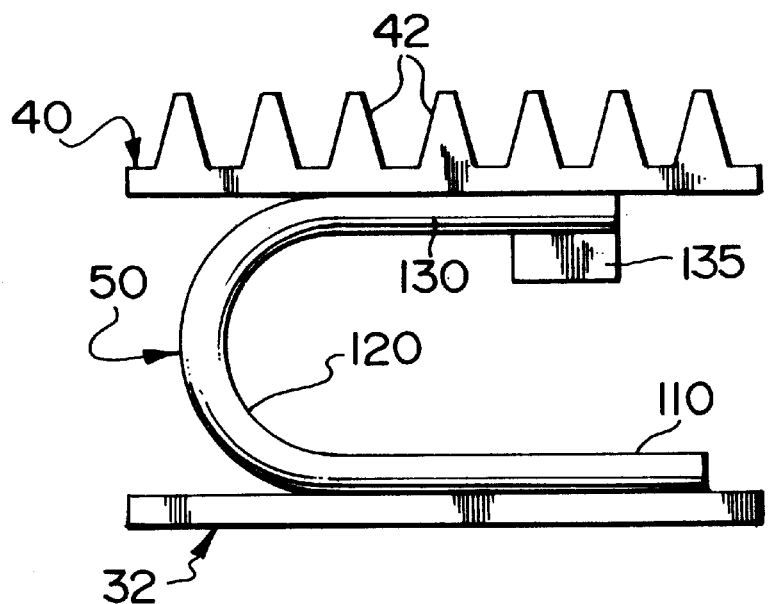
FIG. 4 is illustrative of a heat pipe arrangement in side elevation used in the packaging system of FIG. 1.

In the embodiment of FIGS. 1, 4 heat pipe 50 is used to switch on and off the cooling provided by one of the passive cooling devices, namely the heat sink 40. The heat pipe turns on the cooling provided by the heat sink 40 by providing a low thermal resistance between the heat spreading plate 32 and the heat sink 40 when the temperature of the heat spreading plate 32 is elevated above a predetermined threshold value ($T_{HP}$). Conversely, the heat pipe 50 effectively turns off the cooling provided by the heat sink 40 by providing a high thermal resistance between the heat spreading plate 32 and the heat sink 40 when the temperature of the heat spreading plate drops below the predetermined threshold value ($T_{HP}$). Other forms of thermal transistors or switches may be used to provide the switching on and off of cooling provided by the heat sink 40. Bi-metallic technology for example may be used to switch on and off cooling by using known expansion characteristics of dissimilar metals to provide an increase (switched on) or a decrease (switched off) in pressure between the heat spreading plate 32 and the heat sink 40. Thermostatic technology (such as is used in automobile thermostats) which utilizes the change in volume of a material through expansion properties of solids and liquids may also provide a passive mechanical thermal switch by increasing (switched on) or decreasing (switched off) the pressure between the heat spreading plate 32 and the heat sink 40. Although a convection heat sink 40 is used in the embodiment the invention is not limited to convection heat sinks.

In the event of short term increased thermal loads resulting from increased equipment loads, each 'L' shaped support member 20 may not be capable of efficiently conducting this extra heat to the heat spreading plate 32 or as discussed earlier, the heat pipe 50 by design may not have the capacity to remove this extra heat or be able to respond quickly enough to prevent component temperatures from exceeding rated maximum temperatures. Circuit pack PCM modules 60 as illustrated in FIGS. 1, 2 are disposed adjacent the rear side of circuit packs 18 and are held in thermal contact with a back surface of the major planar arm 22. Increased equipment loads will invariably result in circuit packs 18 dissipating larger amounts of heat energy. This heat energy may be absorbed by the circuit pack PCM modules 60 hence permitting localized cooling of each circuit pack 18 during short term thermal peaks during those time intervals of peak time equipment loads.

Cooling effectiveness using PCM may be enhanced or optimized by the relative placement of the PCM internal to the housing 12. As may be seen in FIG. 1 locating PCM modules 60 generally in close proximity to each circuit pack 18 effectively permits localized cooling of each circuit pack 18 during short term thermal peaks during those time intervals of peak time equipment loads. Cooling effectiveness may be further enhanced by having PCM modules 60 thermally conductively attached to respective major planar arms 22 which are in turn thermally conductively attached to respective substrates 16 of each circuit pack 18. Placement of PCM modules 70 on interior walls 15 of the housing 12 generally will aid in the cooling of the internal ambient temperature should it reach the particular PCM threshold temperature. PCM modules for use adjacent circuit packs 18 may contain different PCM from PCM modules positioned elsewhere in the housing (walls for example) to effectively provide staggered turn on thresholds. One or more walls 15 of the housing 12 may also be used depending on the degree of cooling required. Certain applications may require or benefit from PCM modules being disposed in direct thermal contact with the heat spreading plate 32, alongside the heat pipe 50. Other alternatives are for more than one type of PCM to be used within a single PCM module in order to act as temperature buffers at various times of the year.

Equipment having shelving arrangements which utilize one or more conventional printed circuit board receiving stations may also benefit by having PCM disposed adjacent to respective receiving stations for cooling respective circuit boards when in use.

In the embodiment described the phase change threshold temperature ($T_{PCM}$) for the PCM was chosen to be in the range of 35–60° C. which is higher than the turn on temperature ($T_{HP}$) for the heat pipe of 0° C. (i.e. the heat pipe effectively turns on before the PCM). In other applications or climatic conditions other than North American type climates or even for different applications (e.g. passive cooling of indoor equipment enclosures), the PCM temperature thresholds could be chosen to be the same as or lower than the heat pipe turn on temperature.

PCM modules disposed on one or more exterior walls can be used to advantageously absorb and store solar heat energy during one phase transition and to later release heat energy during the a second phase transition.

Developments in liquid metal technology have provided liquid metals such as Indalloy 117, Indalloy 136, and Indalloy 19 which may be used in PCM modules and which generally have higher densities for the same or similar latent heat of fusion of the more traditional phase change materials. The liquid metals listed above are alloys containing; Indalloy 117 (44.7% Bi, 22.6% Pb, 19.1% In, 8.3% Sn, and 5.3% Cd), Indalloy 136 (49% Bi, 21% In, 18% Pb, and 12% Sn), and Indalloy 19 (51% In, 32.5% Bi, 16.5 Sn).

What is claimed is:

1. A packaging system, comprising:
   a substantially sealed and insulated housing;
   support means disposed internally of the housing for supporting equipment;
   first passive cooling means comprising phase change material disposed internal of the housing for absorbing heat above a first predetermined temperature thereby limiting further increases in temperature internal of the housing;
   second passive cooling means comprising:
     heat sink means disposed externally of the housing; and
     passive switch means for providing a low thermal resistance path between the interior of the housing and the heat sink means above a second predetermined temperature to effect cooling of the equipment and for providing a high thermal resistance between the interior of the housing and the heat sink means below the second predetermined temperature to thereby preserve heat internal of the housing;

an electronic equipment supported by the support means, the electronic equipment having electrical components thermally conductively attached to a substrate, the substrate being thermally conductively attached to a thermally conductive member to form a module and wherein the module is removably thermally conductively attached to the switch means.

2. A packaging system as claimed in claim 1 wherein the phase change material is a paraffin wax.

3. A packaging system as claimed in claim 1 wherein the phase change material is thermally conductively attached to at least one interior wall surface.

4. A packaging system as claimed in claim 1 and further comprising a heat distributing structure disposed throughout the phase change material to more evenly subject the whole of the phase change material to local ambient temperatures.

5. A packaging system as claimed in claim 4 wherein the heat distributing structure comprises a metal substantially honey comb structure.

6. A packaging system as claimed in claim 5 wherein the metal is aluminum.

7. A packaging system as claimed in claim 4 wherein the heat distributing structure comprises a metal filamentary material substantially randomly disposed throughout the phase change material.

8. A packaging system as claimed in claim 1 wherein the heat sink means comprises a convection heat sink.

9. A packaging system, comprising:

a substantially sealed and insulated housing;

support means disposed internally of the housing for supporting equipment;

first passive cooling means comprising phase change material disposed internal of the housing for absorbing heat above a first predetermined temperature, thereby limiting further increases in temperature internal of the housing;

second passive cooling means comprising:

heat sink means, disposed externally of the housing; and passive switch means for providing a low thermal resistance path between the interior of the housing and the heat sink means above a second predetermined temperature to effect cooling of the equipment and for providing a high thermal resistance between the interior of the housing and the heat sink means below the second predetermined temperature to thereby preserve heat internal of the housing; and a thermally conductive heat spreading means disposed internally of the housing and being thermally conductively attached to the switch means for efficiently passing heat internally of the housing to the switch means.

10. A packaging system as claimed in claim 9, further comprising electronic equipment having electrical components thermally conductively attached to a substrate, the substrate being thermally conductively attached to a thermally conductive member to form a module and wherein the module is removably thermally conductively attached to the heat spreading means.

11. A packaging system as claimed in claim 10, comprising a plurality of modules each of which is removably thermally conductively attached to the heat spreading means whereby individual module heat is combined and efficiently conducted to the switch means.

12. A packaging system as claimed in claim 10, wherein the phase change material is disposed adjacent the substrate and in thermal contact with the conductive member of the module to thereby be capable of limiting short term temperature increases local to the substrate.

13. A packaging system as claimed in claim 1 or any one of claims 9–12 wherein the switch means includes a heat pipe.

14. A packaging system as claimed in claim 13 wherein the heat pipe is a variable conductance heat pipe.

15. A packaging system as claimed in claim 1 or 9 wherein the second predetermined temperature at which the switch means provides a low thermal resistance path is higher than the first predetermined temperature at which the phase change material starts to change phase.

* * * * *